(12) United States Patent
Helvajian

(10) Patent No.: US 9,945,032 B2
(45) Date of Patent: Apr. 17, 2018

(54) SYSTEMS AND METHODS FOR ENHANCING MOBILITY OF ATOMIC OR MOLECULAR SPECIES ON A SUBSTRATE AT REDUCED BULK TEMPERATURE USING ACOUSTIC WAVES, AND STRUCTURES FORMED USING SAME

(71) Applicant: The Aerospace Corporation, El Segundo, CA (US)

(72) Inventor: Henry Helvajian, Pasadena, CA (US)

(73) Assignee: The Aerospace Corporation, El Segundo, CA (US)

(*) Notice: Subject to any disclaimer, the term of this patent is extended or adjusted under 35 U.S.C. 154(b) by 0 days.

(21) Appl. No.: 15/053,878

(22) Filed: Feb. 25, 2016

(65) Prior Publication Data
US 2016/0208383 A1 Jul. 21, 2016

Related U.S. Application Data

(62) Division of application No. 13/739,879, filed on Jan. 11, 2013, now Pat. No. 9,303,309.

(51) Int. Cl.
| | |
|---|---|
| *B32B 17/06* | (2006.01) |
| *C23C 16/48* | (2006.01) |
| *C23C 14/22* | (2006.01) |
| *C23C 16/44* | (2006.01) |

(52) U.S. Cl.
CPC .......... *C23C 16/483* (2013.01); *C23C 14/22* (2013.01); *C23C 16/4415* (2013.01); *C23C 16/48* (2013.01); *Y10T 428/31507* (2015.04); *Y10T 428/31786* (2015.04); *Y10T 428/31935* (2015.04); *Y10T 428/31938* (2015.04)

(58) Field of Classification Search
USPC ................................ 428/688, 689, 701, 702
See application file for complete search history.

(56) References Cited

U.S. PATENT DOCUMENTS

| | | | |
|---|---|---|---|
| 4,249,418 | A | 2/1981 | Ebata |
| 4,399,441 | A | 8/1983 | Vaughan et al. |
| 4,633,715 | A | 1/1987 | Monchalin |
| 4,966,459 | A | 10/1990 | Monchalin |
| 5,080,491 | A | 1/1992 | Monchalin et al. |

(Continued)

FOREIGN PATENT DOCUMENTS

| | | |
|---|---|---|
| DE | 4205832 A1 | 9/1993 |
| JP | H09199426 A | 7/1997 |

OTHER PUBLICATIONS

Ahn et al., "Representation of surface roughness in fused deposition modeling," J. Mater. Process. Technol. 209:5593-5600 (2009).

(Continued)

*Primary Examiner* — Lauren R Colgan
(74) *Attorney, Agent, or Firm* — Jones Day; Jaime D. Choi

(57) ABSTRACT

Under one aspect, a structure is provided that includes a substrate including a first material having a threshold temperature above which the first material is damaged and a layer consisting essentially of a second material molecularly bonded to the first material of the substrate. The second material is formed on the substrate at a reaction temperature that is higher than the threshold temperature of the first material. An interface between the substrate and the second material is a substantially defect-free surface.

3 Claims, 10 Drawing Sheets

(56) References Cited

U.S. PATENT DOCUMENTS

| | | | |
|---|---|---|---|
| 5,136,172 A | 8/1992 | Nakata et al. | |
| 5,208,643 A | 5/1993 | Fair | |
| 5,410,405 A | 4/1995 | Schultz et al. | |
| 5,446,452 A | 8/1995 | Litton | |
| 5,569,502 A | 10/1996 | Koinuma et al. | |
| 5,721,615 A | 2/1998 | McBride et al. | |
| 6,256,100 B1 | 7/2001 | Banet et al. | |
| 6,795,198 B1 | 9/2004 | Fuchs et al. | |
| 7,434,989 B2 | 10/2008 | Solie | |
| 7,526,357 B2 | 4/2009 | Livingston et al. | |
| 7,541,103 B2* | 6/2009 | Leu | C08J 7/04 428/413 |
| 7,884,047 B2* | 2/2011 | Labrousse | C03C 17/3417 428/357 |
| 9,303,309 B2 | 4/2016 | Helvajian | |
| 2002/0055012 A1* | 5/2002 | Chou | B32B 9/00 428/688 |
| 2002/0076727 A1* | 6/2002 | Cardone | C07K 17/06 435/7.1 |
| 2003/0094032 A1 | 5/2003 | Baklanov et al. | |
| 2007/0131871 A1 | 6/2007 | Chang et al. | |
| 2010/0089615 A1* | 4/2010 | Kuchiyama | C03C 17/3441 174/126.4 |
| 2010/0102280 A1* | 4/2010 | Ford | B05D 1/002 252/502 |
| 2010/0215643 A1* | 8/2010 | Clevenger | A01N 25/08 514/1.1 |
| 2010/0215985 A1* | 8/2010 | Kitano | C01B 31/022 428/688 |
| 2011/0064943 A1* | 3/2011 | Wang | H01B 1/04 428/332 |
| 2011/0123776 A1* | 5/2011 | Shin | C23C 16/26 428/172 |
| 2012/0070612 A1* | 3/2012 | Lee | B32B 9/007 428/141 |
| 2013/0327392 A1* | 12/2013 | Weitekamp | H01L 31/02363 136/256 |
| 2014/0199550 A1 | 7/2014 | Helvajian | |
| 2014/0227477 A1* | 8/2014 | Cola | H01L 23/373 428/98 |

OTHER PUBLICATIONS

Bachari et al., "Structural and Optical Properties of Sputtered ZnO Films," Thin Solid Films 348:165-172 (1999).
Bao et al., "Transport Powder and Liquid Samples by Surface Acoustic Waves," Proc. of SPIE 7:72910M through 1-72910M-7 (2009).
Bhatia, "Scattering of High-Frequency Sound Waves in Polycrystalline Materials," J. Acoust. Soc. Am. 31(1):16-23 (1959).
Briggs, "Acoustic microscopy—a summary," Rep. Prog. Phys. 55:851-909 (1992).
Cammack, R. et al., "Oxford Dictionary of Biochemistry and Molecular Biology—Adsorption," 2006, Oxford University Press, 2nd Ed., pp. 20-21.
Cerniglia et al., "Inspection of additive-manufactured layered components," Ultrasonics. 2015 62:292-298 (2015).
Cheeke, Fundamentals and Applications of Ultrasonic Waves, Chapters 8 and 10, CRC Press LLC, Boca Raton, Florida, 54 pages (2002).
Christman, D. R., et al. "Measurements of dynamic properties of materials vol. III: 6061-T6 aluminum." DNA Report, DASA 2501-3, AD735966 (1971).
Chryssolouris, G. (1994). Sensors in laser machining. CIRP Annals-Manufacturing Technology, 43(2), 513-519.
Clark, J. "Intermolecular Bonding—Van der Waals Forces," Sep. 2012, Retrieved from the Internet: URL: http:www.chemguide.co.uk/atoms/bonding/vdw.html, retrieved on Jul. 28, 2015, pp. 1-8.
Cosenza et al., "Generation of Narrowband Antisymmetric Lamb Waves Using a Formed Laser Source in the Ablative Regime," IEEE Trans. Ultrason. Ferroelectr. Freq. Control 54(1):147-156 (2007).
Daintith, J. et al., "Dictionary of Science—Hydrogen Bond," 2010, Oxford University Press, 6th Ed., pp. 404-405.
Dewhurst et al., "Optical emote measurement of ultrasound," Meas. Sci. Technol. 10:R139-R168 (1999).
Doubenskaia et al., "Comprehensive Optical Monitoring of Selective Laser Melting," JLMN 7(3):236-243 (2012).
Elhadj, S, Matthews, M J, & Yang, S T. (2012). Combined infrared thermal imaging and laser heating for the study of materials thermophysical and processing properties at high temperatures. Critical Reviews in Solid State and Materials Sciences, vol. 39, No. 3, Mar. 28, 2014, pp. 175-196. Retrieved from http://www.osti.gov/scitech/servlets/purl/1132002.
Frazier, "Metal Additive Manufacturing: A Review," JMEPEG 23:1917-1928 (2014).
Greer et al., "Nanoscale gold pillars strengthened through dislocation starvation," Phys. Rev. B 73:245410-1 through 245410-6 (2006).
Gu et al., "Laser additive manufacturing of metallic components: materials, processes and mechanisms," International Materials Reviews 57(3):133-164 (2012).
Hariharan, Handbook of Optics vol. II (Michael Bass et al., Eds.; McGraw-Hill, Inc., New York), Chapter 21 Interferometers, Division of Applied Physics, CSIRO, Sydney, Australia. pp. 21.1-21.28 (1995).
Hazan et al., "Effective Prevention of Microbial Biofilm Formation on Medical Devices by Low-Energy Surface Acoustic Waves," Antimicrob. Agents Chemother. 50(12):4144-4152 (2006).
Herderick, "Progress in Additive Manufacturing," JOM 67(3):580-581 (2015).
Hess, "Surface Acoustic Waves in Materials Science," Phys. Today 42-47 (2002).
Hubert et al., "Contactless ultrasonic device to measure surface acoustic wave velocities versus temperature," Rev. Sci. Instrum. 78:024901 (2007).
Hurley et al., "Surface Acoustic Wave Methods to Determine the Anisotropic Elastic Properties of Thin Films," Meas. Sci. Technol. 12:1486-1494 (2001).
Kaplan, S.M., "Electrical and Electronics Engineering Dictionary," pp. 81-82 (2004).
Kenderian et al., "Narrow band laser-generated surface acoustic waves using a formed source in the ablative regime," J. Acoust. Soc. Am. 113(1):261-266 (2003).
Kino, Gordon S. Acoustic waves: devices, imaging, and analog signal processing. vol. 107. Englewood Cliffs, NJ: Prentice-Hall, 1987.
Koyama et al., "Noncontact ultrasonic transportation of small objects in a circular trajectory in air by flexural vibrations of a circular disc," IEEE Trans. Ultrason. Ferroelectr. Freq. Control. 57(6):1434-1442 (2010).
Kruth et al., "Selective laser melting of iron-based powder," J. Mat. Proc. Tech. 149:616-622 (2004).
Leong et al., "Ultrasonic Separation of Particulate Fluids in Small and Large Scale Systems: A Review," Ind. Eng. Chem. Res. 52:16555-16576 (2013).
Ma et al., "Fast diffusion of water nanodroplets on graphene," Nat. Mater. 15(1):66-71 (2016) (Epub Oct. 19, 2015).
Manzo et al., "Application of a laser heterodyne technique to characterize surface acoustic waves generated via a pulsed laser excitation," Proc. of SPIE vol. 8967 (7 pages) 2014.
Manzo et al., "Demonstration of enhanced surface mobility of adsorbate cluster species by surface acoustic wave excitation induced by a pulsed laser," Proc. of SPIE vol. 8969 (8 pages) 2014.
Mavrikakis et al., "Effect of Strain on the Reactivity of Metal Surfaces," Phys. Rev. Lett. 81(13):2819-2822 (1998).
McKeen, L.W., "Effect of Temperature and Other Factors on Plastics and Elastomers," 2008, William Andrew Publishing/Plastics Design Library, 2nd Ed., pp. 1.
Mireles et al., "Closed-loop automatic feedback control in electron beam melting," Int. J. Adv. Manuf. Technol. 78:1193-1199 (2015).
Monchalin, "Optical Detection of Ultrasound," IEEE T. Ultrason. Ferr. UFFC-33(5):485-499 (1986).

(56) References Cited

OTHER PUBLICATIONS

Nadal et al., "Continuous model for the shear modulus as a function of pressure and temperature up to the melting point: Analysis and ultrasonic validation," J. Appl. Phys. 93(5):2472-2480 (2003).
Ni et al., "Effect of Pretreatment on PET Films and its Application for Flexible Amorphous Silicon Solar Cells," IEEE pp. 000293-000296 (2009).
Ogi et al, "Ultrasonic attenuation and grain-size evaluation using electromagnetic acoustic resonance," J. Acoust. Soc. Am. 98(1):458-464 (1995).
Pandey et al., "Improvement of surface finish by staircase machining in fused deposition modeling," J. Mater. Process. Technol. 132:323-331 (2003).
Papadakis, "Revised Grain-Scattering Formulas and Tables," J. Acoust. Soc. Am. 37(4):703-710 (1965).
Pedersen et al., "Surface Plasmon Resonance Spectroscopy of Gold Nanoparticle-Coated Substrates," Defence R&D Canada-Suffield, Technical Report (2005).
Pettenkofer et al., "Morphology of the Si/Zno Interface," FVS Workshop pp. 22-29 (2002).
Popa et al., "Active acoustic metamaterials reconfigurable in real time," Phys. Rev. B 91:220303-1 through 220303-5 (2015).
Pyka et al., "Surface Roughness and Morphology Customization of Additive Manufactured Open Porous Ti6A14V Structures," Materials 6:4737-4757 (2013).
Ruffino et al., "Self-organization of gold nanoclusters on hexagonal SiC and SiO2 surfaces," J. Appl. Phys. 101:064306-1 through 064306-7 (2007).
Sajeesh et al., "Particle separation and sorting in microfluidic devices: a review," Microfluid Nanofluid 17:1-52 (2014).
Scruby et al., "The Launching of Rayleigh Waves from Surface Point Sources," Rayleigh-Wave Theory and Application pp. 102-109 (1985).
Seminario et al., "Clustering Effects on Discontinuous Gold Film NanoCells," J. Nanosci. Nanotech. 4(7):1-11 (2004).
Strano et al., "Surface roughness analysis, modelling and prediction in selective laser melting," J. Mater. Process. Technol. 213:589-597 (2013).
Takahashi et al., "New Thin Film Fabrication Technique Using a Substrate Excited by SAW," IEEE Transactions on Magnetics 26(5):1453-1455 (1990).
The American Heritage Dictionary, "Bandwidth," 2011 (1 page).
Tokiy et al., "Temperature Dependence of Elastic Moduli of Submicrocrystalline Copper," Phys. Solid State 56 (5):1002-1005 (2014).
Valiveti et al., "Influence of Thermal Annealing and Ion Irradiation on Zinc Silicate Phases in Nanocomposite ZnO—SiOx Thin Films," Appl. Surf. Sci. 317:1075-1079 (2014).
Van Bael et al., "Micro-CT-based improvement of geometrical and mechanical controllability of selective laser melted Ti6Al4V porous structures," Mater Sci. Eng., A 528:7423-7431 (2011).
Varshni, "Temperature Dependence of the Elastic Constants," Phys. Rev. B 2(10):3952-3958 (1970).
Xuan et al., "Particle focusing in microfluidic devices," Microfluid Nanofluid 6:1-16 (2010).
Yadroitsev et al., "Surface Morphology in Selective Laser Melting of Metal Powders," Physics Procedia 12:264-270 (2011).
Zhu et al., "Temperature and Strain-Rate Dependence of Surface Dislocation Nucleation," Phys. Rev. Lett. 100 (2):2025502-1 through 025502-4 (2008) (Epub Jan. 15, 2008).
United States Patent and Trademark Office, Final Office Action for U.S. Appl. No. 13/739,879, dated Aug. 11, 2015 (32 pages).
United States Patent and Trademark Office, Non-Final Office Action for U.S. Appl. No. 13/739,879, dated Feb. 11, 2015 (28 pages).
United States Patent and Trademark Office, Notice of Allowance for U.S. Appl. No. 13/739,879, dated Dec. 29, 2015 (14 pages).

\* cited by examiner

SYSTEMS AND METHODS FOR ENHANCING MOBILITY OF ATOMIC OR MOLECULAR SPECIES ON A SUBSTRATE AT REDUCED BULK TEMPERATURE USING ACOUSTIC WAVES, AND STRUCTURES FORMED USING SAME

CROSS-REFERENCE TO RELATED APPLICATIONS

This application is a divisional under 35 U.S.C. § 121 of U.S. patent application Ser. No. 13/739,879, filed on Jan. 11, 2013, the entire contents of which are incorporated by reference herein.

STATEMENT OF GOVERNMENT INTEREST

This invention was made with government support under Contract No. FA8802-09-C-0001 awarded by the Department of the Air Force. The government has certain rights in the invention.

FIELD OF THE INVENTION

This application relates to the mobility of molecular species on a substrate.

BACKGROUND OF THE INVENTION

A variety of gas-phase techniques for depositing materials on a substrate are known in the art, including physical vapor deposition (PVD) based techniques such as evaporation, sputtering, molecular beam epitaxy (MBE), and pulsed laser deposition (PLD), and a wide variety of chemical vapor deposition (CVD) based techniques, including atomic layer deposition (ALD). These techniques are ubiquitous in the development of novel materials and films that have a wide range of applications from consumer electronics to biology or medicine, from architectural engineering to aerospace. Both PVD and CVD based techniques may include exposing the substrate to an atomic or molecular species at a set of processing parameters that are selected based on the deposition technique to be used, the material to be deposited, and the substrate upon which the material is to be deposited.

For example, FIGS. 1A-1B schematically illustrate structures that may be formed during a previously known gas-phase material deposition technique. As illustrated in FIG. 1A, substrate 110 may be exposed to an atomic or molecular species 120 that is in the gas phase. In the evaporation and MBE techniques, such gas phase atomic or molecular species 120 may be formed by heating and evaporating a material using a variety of known power sources, including a resistive or radiative heater or an electron beam. The PLD technique is similar, but irradiates a material using a pulsed laser to generate gas phase atomic or molecular species 120. In the sputtering technique, such gas phase atomic or molecular species 120 may be formed by bombarding a material with energetic particles so as to liberate molecules of the material into the gas phase; the energetic particles may be generated using a variety of known sources, including a plasma, an ion source, a particle accelerator, or a radioactive material. In the CVD and ALD techniques, such gas phase atomic or molecular species 120 may be stored separately in gaseous form and introduced to a reaction chamber that contains the substrate; the species optionally may be activated using a suitable source, such as with a plasma, combustion, or thermal decomposition.

As illustrated in FIG. 1A, gas phase atomic or molecular species 120 may adsorb onto substrate 110, forming adsorbed atomic or molecular species 120'. Upon such adsorption, atomic or molecular species 120' may form a molecular bond with substrate 110, e.g., a covalent or ionic bond, or a bond based on dipole-dipole interactions, London dispersion force, or hydrogen bonding. Upon such bonding with substrate 110, atomic or molecular species 120' may directly form material 140 disposed on substrate 110, as illustrated in FIG. 1B, or may first undergo a further chemical reaction, e.g., with substrate 110, with another atomic or molecular species 120' adsorbed to substrate 110, or with another gas phase atomic or molecular species 120, to form material 140 illustrated in FIG. 1B. In many situations, the adsorbed atomic or molecular species 120' may move along the surface to find the right accommodation (e.g., site on substrate 110, or another gas phase or adsorbed atomic or molecular species) for the ultimate reaction to occur. At the macroscopic level, the processing parameters used during a given material deposition technique may include the type and power level of any source selected to assist with generating or activating gas phase atomic or molecular species 120; any electrical bias that may be applied to substrate 110; any heating or cooling that may be applied to gas phase atomic or molecular species 120 or to substrate 110; the flow rate or concentration of gas phase atomic or molecular species 120; the pressure or partial pressure of gas phase atomic or molecular species 120; and the amount of time with which substrate 110 is exposed to gas phase atomic or molecular species 120.

At the microscopic level, the energy barrier that may be required to convert gas phase atomic or molecular species 120 illustrated in FIG. 1A into material 140 illustrated in FIG. 1B may be far lower than the total amount of energy provided by the processing parameters. In this regard, at the microscopic level, substrate 110 may be viewed as an energy "sink" toward which atomic or molecular species 120 is attracted, and additional energy may be applied to "agitate" adsorbed atomic or molecular species 120'—that is, to enhance the mobility of species 120 on substrate 110—to convert species 120' into material 140. The conversion of species 120 to material 140 thus may be considered to have two different types of energy deficits, the first arising from the particular chemical reactivity of atomic or molecular species 120, and the second being of a more general thermodynamic and kinetic nature.

The processing parameters may nominally provide the amount of energy that may be required at the microscopic level to overcome both the first and second types of energy deficits. However, such processing parameters may be applied at the macroscopic or "bulk" level and thus applied to the entirety of substrate 110 and to all gas phase species 120 and all adsorbed species 120'. For example, as illustrated in FIGS. 1A-1B, substrate 110 may be disposed on heater 130 that heats substrate 110 to a temperature sufficient to enhance the mobility of absorbed species 120' to convert such species into material 140. However, such bulk heating may produce a number of engineering constraints that may limit the type of material 140 that may be deposited on a particular substrate 110. Specifically, the material from substrate 110 is made, including the materials of any structures buried therein, must be compatible with the bulk heating temperature used; while the substrate is maintained at the bulk heating temperature, other objects in the reaction chamber preferably are kept sufficiently cool to inhibit contamination; and supporting hardware to maintain substantially uniform heating, cooling, or temperature stability must be provided to maintain uniform growth of material 140 on substrate 110. In particular, elevated temperatures may cause materials buried within substrate 110 to diffuse into each other or into substrate 110, thus damaging the materials.

Thus, what is needed is a way to enhance mobility of adsorbed atomic or molecular species on a substrate, while reducing the bulk temperature of the substrate.

SUMMARY OF THE INVENTION

Embodiments of the present invention provide systems and methods for enhancing mobility of atomic or molecular species on a substrate at reduced bulk temperature using acoustic waves, and structures formed using the same. In particular, the energy from a pulsed laser, under controlled parameters, may be converted into acoustic waves that propagate across a substrate and enhance molecular mobility at distance removed from the source of the acoustic waves. With this ability, embodiments of the invention allow for the development of a non-contact, non-intrusive method for preparing materials that may be adapted for use with existing materials processing reaction chambers. The enhanced mobility induced by acoustic waves additionally, or alternatively, may be used to remove atomic or molecular species adsorbed on a substrate surface as a way of "cleaning" or sterilizing the substrate or to inhibit specific molecular species from ever residing on a surface, or to gather or pattern adsorbed atomic or molecular species to one or more selected locations on a surface.

Under one aspect of the present invention, a method for enhancing mobility of an atomic or molecular species on a substrate may include exposing a first region of a substrate to an atomic or molecular species that forms a molecular bond with the substrate in the first region; directing a laser pulse to a second region of the substrate so as to generate an acoustic wave in the second region, the acoustic wave having spatial and temporal characteristics selected to alter the molecular bond; and transmitting the acoustic wave from the second region to the first region, the acoustic wave altering the molecular bond between the substrate and the atomic or molecular species to enhance mobility of the atomic or molecular species on the substrate in the first region.

Responsive to the altering of the molecular bond, the atomic or molecular species may translate (e.g., hop or jump) laterally across the substrate in a direction defined by the spatial and temporal characteristics of the acoustic wave. Alternatively, or additionally, responsive to the altering of the molecular bond, the atomic or molecular species may form a material (e.g., may form nanometer sheets of graphene films by epitaxial growth). Alternatively, responsive to the altering of the molecular bond, the atomic or molecular species may dissociate (e.g., shed atoms) to form more chemically energetic species, such as radicals, that induce surface chemical reaction (e.g., formation of graphene by methane/ethane carbon source adsorption). The substrate may have a damage threshold temperature and wherein in the absence of the acoustic wave, the atomic or molecular species may form the material or otherwise diffuse only at a reaction temperature that is higher than the damage threshold temperature of the substrate. For example, the substrate may include an integrated circuit, a chalcogenide glass, a ZBLAN glass, or a polymer such as polycarbonate, poly (methyl methacrylate), polystyrene, polyvinyl chloride, or polyethylene terephthalate. The material may include silicon nitride, graphene, carbon nanotubes, diamond, titanium dioxide, titanium boride, zirconium oxide, yttria-stabilized zirconium, boron carbide, boron nitride, or metal. Alternatively, there may be the desire to form a material (e.g., graphene) using a convenient molecular source (e.g., methane) but at much lower temperatures (e.g., currently ~800 C or above may be required).

In some embodiments, the laser pulse has a temporal duration of less than about 1 nanosecond at FWHM, or 1 picosecond at FWHM, or less than about 100 femtoseconds at FWHM. The laser pulse may be focused to a point in the second region of the substrate and the acoustic wave is transmitted radially from the point. Alternatively, the laser pulse may be focused to a line in the second region of the substrate and the acoustic wave is transmitted linearly from the line as a plane wave. Alternatively, the laser pulse may be focused to form a pattern in the second region of the substrate so as to generate a complex radiating acoustic pattern.

In some embodiments, the acoustic wave includes a Rayleigh wave, which may have a bandwidth of 100 MHz at FWHM or more.

The molecular bond may include a covalent bond, an ionic bond, or a bond based on dipole-dipole interactions, London dispersion force, or hydrogen bonding.

Under another aspect of the present invention, a structure may include a substrate having a damage threshold temperature; and a material disposed on the substrate, the material having a reaction temperature that is higher than the damage threshold temperature of the substrate.

The substrate may include an integrated circuit, a chalcogenide glass, a ZBLAN glass, or a polymer such as polycarbonate, poly(methyl methacrylate), polystyrene, polyvinyl chloride, or polyethylene terephthalate. The material may include silicon nitride, graphene, carbon nanotubes, diamond, titanium dioxide, titanium boride, zirconium oxide, yttria-stabilized zirconium, boron carbide, boron nitride, or metal.

DETAILED DESCRIPTION

Figure 1A:
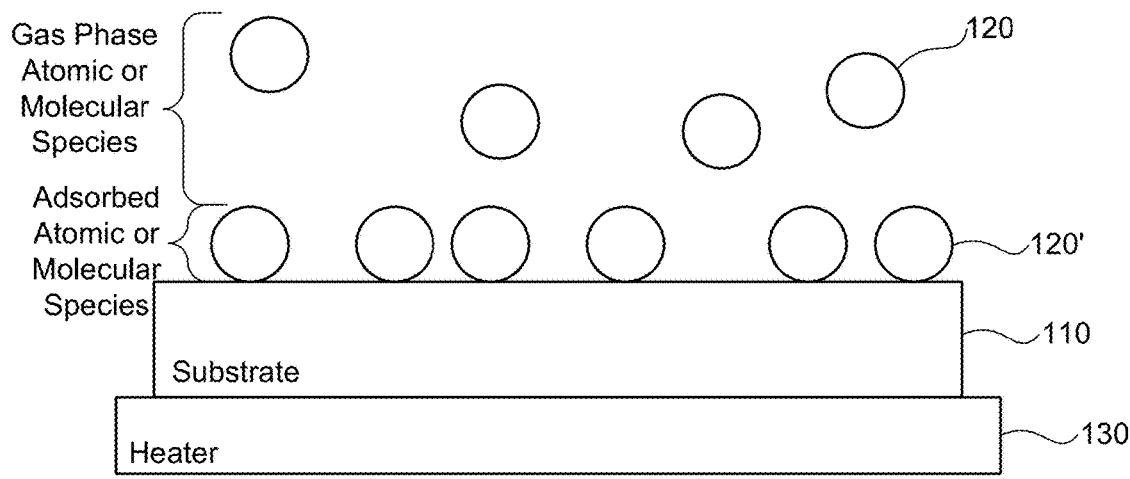
FIGS. 1A-1B schematically illustrate structures that may be formed during a previously known method for preparing a material.
Figure 1B:
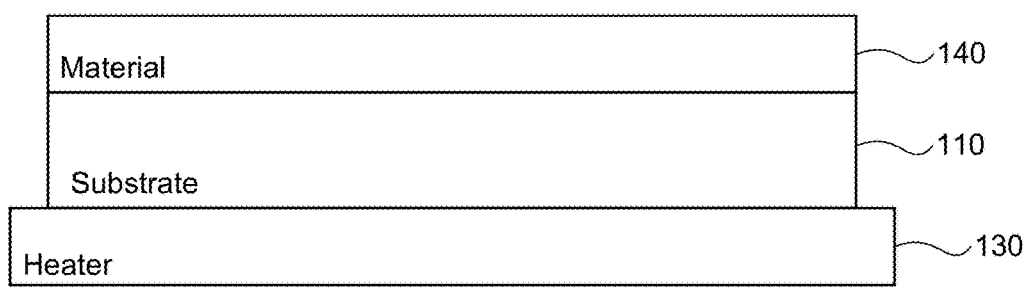

Embodiments of the present invention provide systems and methods for enhancing mobility of molecular species on a substrate at reduced bulk temperature using acoustic waves, and structures formed using the same. In particular, embodiments of the present invention may provide systems and methods of preparing materials or processing substrates by enhancing the mobility or diffusion of molecular species on a substrate surface by irradiating the substrate with a relatively short laser pulse to generate an acoustic wave that then alters a molecular bond, e.g., alters the strength of a molecular bond, between the atomic or molecular species and substrate. Such alteration enhances the mobility of the atomic or molecular species on the substrate by reducing chemical bonding barriers that may entrap an atomic or molecular species at a specific site on the substrate. For example, responsive to the alteration of the molecular bond, the atomic or molecular species may translate laterally across the substrate in a direction defined by the spatial and temporal characteristics of the acoustic wave, which in turn are defined by the spatial and temporal characteristics of the laser pulse. Or, for example, responsive to the alteration of the molecular bond, the atomic or molecular species may chemically react to form a material. As such, by enhancing mobility of the atomic or molecular species on the substrate using acoustic waves, the temperature of the substrate may be reduced relative to what otherwise may have been required to achieve comparable mobility via bulk heating.

Accordingly, some embodiments of the present invention may allow materials that are technologically important, but that have relatively high reaction temperatures, to be deposited on substrates that have damage threshold temperatures that are lower than such reaction temperatures. Examples of such materials may include silicon nitride ($SiN_x$), graphene, carbon nanotubes, diamond, titanium dioxide ($TiO_2$), titanium boride ($TiB_2$), zirconium oxide ($ZrO_2$), yttria-stabilized zirconium (YSZ), boron carbide ($B_4C$), boron nitride (BN), or a metal, and examples of such substrates may include integrated circuits, chalcogenide glasses, fluoride glasses such as $ZrF_4$—$BaF_2$—$LaF_3$—$AlF_3$—NaF (ZBLAN) glasses, or polymers, e.g., polycarbonate, poly(methyl methacrylate), polystyrene, polyvinyl chloride, or polyethylene terephthalate. Or, for example, some embodiments of the present invention may allow undesired atomic or molecular debris to be cleaned, removed, or directed from a substrate surface, by using the acoustic waves to enhance diffusion of such debris on the surface.

First, some exemplary structures that may be formed using the present invention, and an illustrative method for forming same, will be provided. Then, an exemplary system for implementing such a method will be described. Lastly, several experiments that have been performed that demonstrate enhanced molecular mobility will be described.

Figure 2A:
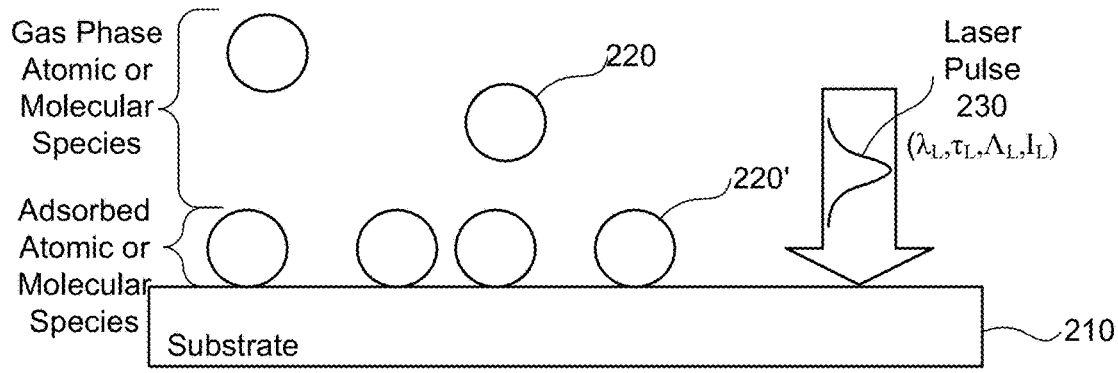
FIGS. 2A-2D schematically illustrate structures that may be formed during a method for preparing a material at reduced bulk temperature by enhancing mobility of molecular species with an acoustic wave, according to one exemplary embodiment of the present invention.

FIGS. 2A-2D illustrate structures that may be formed during steps of some embodiments of the inventive method. Specifically, as illustrated in FIG. 2A, substrate 210 may be exposed to an atomic or molecular species 220 that is in the gas phase, and that may be generated by any suitable technique, e.g., any PVD or CVD process that is previously known, such as those described above, or that is yet to be developed. Gas phase atomic or molecular species 220 may adsorb onto substrate 210, forming adsorbed atomic or molecular species 220'. Upon such adsorption, atomic or molecular species 220' may form a molecular bond with substrate 210, e.g., a covalent or ionic bond, or a bond based on dipole-dipole interactions, the London dispersion force, or hydrogen bonding. Such a molecular bond may be distinguished from bonds that may form between larger (non-molecular) particles and substrate 210, e.g., particles that have greater than about 10 atoms, or greater than about 100 atoms, or greater than about 1000 atoms, which instead may be based on space-charge or coulombic interactions.

As illustrated in FIG. 2A, a first portion of substrate 210 may be irradiated with laser pulse 230, which may have a set of preselected characteristics including a set of optical wavelengths $\lambda_L$, a temporal duration $\tau_L$, a spatial profile $\Lambda_L$, and an intensity $I_L$. In embodiments in which the laser pulse is optically, temporally, or spatially Gaussian, such parameters may be described by their full width of the pulse at half of the pulse's maximum (FWHM). In embodiments in which the laser pulse has more complex features, e.g., contains optical wavelengths that are not contiguous with one another, contains multiple discrete temporal features, or has multiple discrete spatial features, such parameters may be described as appropriate. Additionally, the laser repetition rate R(t), the laser pulse amplitudes A(t), or the burst rate (number of laser shots per burst) B(t), each may be individually varied to enhance the generation of the acoustic wave while inhibiting damage to substrate 210. Preferably, the set of optical wavelengths 4 of laser pulse 230 is at least partially absorbed by substrate 210, and thus heats the irradiated first portion of substrate 210. In some embodiments, the first portion of substrate 210 may include a coating (not illustrated) having optical characteristics selected to at least partially absorb the set of optical wavelengths $\lambda_L$ of laser pulse 230.

Figure 2B:
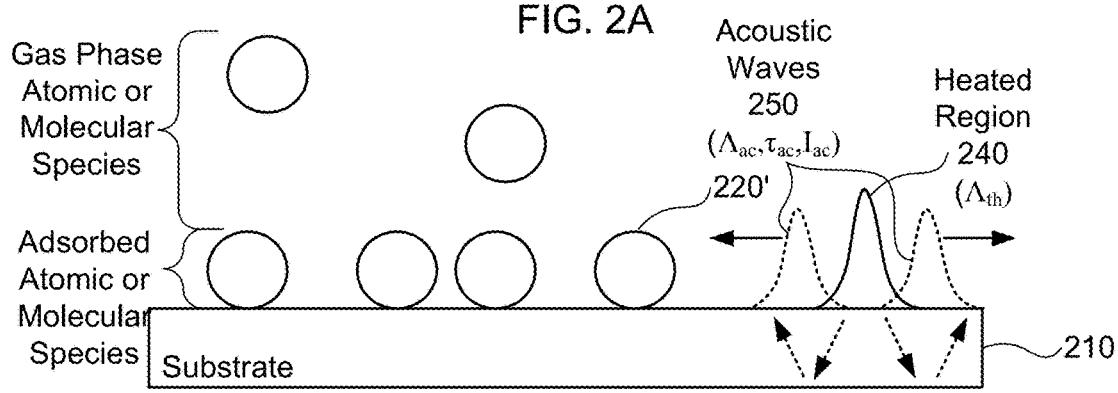

Preferably, the temporal duration $\tau_L$ of laser pulse 230 is relatively short so as to cause sufficiently rapid thermal expansion of substrate 210 as to generate acoustic waves 250 illustrated in FIG. 2B. For example, laser pulse 230 may have a substantially Gaussian temporal profile, and may have a temporal duration of less than about 10 nanoseconds at FWHM, or less than about 1 nanosecond at FWHM, or less than about 100 picoseconds at FWHM, or less than about 10 picoseconds at FWHM, or less than about 1 picosecond at FWHM, or less than about 100 femtoseconds at FWHM, in one example about 8-10 nanoseconds at FWHM. Additionally, the spatial profile $\Lambda_L$ of laser pulse 230 is relatively small in at least one dimension, such that the acoustic wave has a sufficiently small spatial profile in that dimension to sufficiently alter the molecular bond between adsorbed atomic or molecular species 220' and substrate 210, and thus to enhance mobility of atomic or molecular species 220' on substrate 210. For example, laser pulse 230 may be focused to a point, to a line, or to a more complicated pattern, as appropriate. In some embodiments, the spatial profile $\Lambda_L$ of laser pulse 230 may have a dimension of about 20 microns or less in at least one dimension, or less than about 10 microns or less in at least one dimension, or less than about 5 microns or less in at least one dimension, or less than about 2 microns or less in at least one dimension. Preferably, the intensity $I_L$ of laser pulse 230 is selected so as to reduce or inhibit damage to substrate 210, but at the same time to generate acoustic wave having sufficient amplitude, in combination with the other acoustic wave parameters, to alter molecular bonds between adsorbed atomic or molecular species 220' and substrate 210. To mitigate local damage that may be induced by the laser, the laser pulse 230 may be repeatedly moved (scanned) across the surface of substrate 210, e.g., using reflecting mirror 590 described in greater detail below with reference to FIG. 5. In one embodiment, the intensity $I_L$ of laser pulse 230 is selected so as to induce a thermoelastic material response in substrate 210. Laser pulse 230 may be generated by any suitable pulsed laser, such as an diode pumped, Q-switched, Nd-Vanadate ultrafast laser, or a diode pumped, cavity dumped, Nd-Vanadate ultrafast laser or a flashlamp pumped Nd-YAG nanosecond pulse laser.

It should be appreciated that the spatial profile $\Lambda_{ac}$ and intensity $I_{ac}$ of the acoustic wave depend not only on the spatial profile $\Lambda_L$ and intensity $I_L$ of laser pulse 230, but also on the temporal duration $\tau_L$ of the laser pulse, the thermal expansion coefficient of substrate 210, and the rate at which substrate 210 expands responsive to deposition of heat by the laser pulse. Specifically, as illustrated in FIG. 2B, the spatial profile $\Lambda_{th}$ of heated region 240 may be defined by, and in some embodiments may be substantially the same as, the spatial profile $\Lambda_L$ of laser pulse 230. The spatial profile $\Lambda_{ac}$ of the acoustic waves 250 resulting from rapid thermal expansion of substrate 210 within heated region 240 may be defined by, and in some embodiments may be substantially the same as, the spatial profile $\Lambda_{th}$ of heated region 240. However, if temporal duration $\tau_L$ of laser pulse 230 is too long, then the laser pulse will not cause heated region 240 of substrate 210 to thermally expand with sufficient rapidity to generate acoustic waves 250. Waves 250 have a temporal profile $\tau_{ac}$ based on the waves' respective spatial profiles $\Lambda_{ac}$ and the speed of sound v in the material for waves having such a spatial profile, and a bandwidth that is inversely proportional to the temporal profile $\tau_{ac}$. Acoustic waves 250 may include surface waves or bulk waves (e.g., longitudinal or transverse waves or harmonics thereof, or combinations thereof), as denoted by the dashed arrows within substrate 210. Preferably, acoustic waves 250 have a bandwidth of at least 100 MHz at FWHM, or at least 250 MHz at FWHM, or at least 1 GHz at FWHM, or at least 100 GHz at FWHM, or at least 1 THz or more.

As is known in the art, acoustic waves conform to mathematical analysis by the wave equation, and consequently have attributes common to waves in general, such as wave interference. In preferred embodiments, acoustic waves 250 include one or more modes that are substantially confined at the interface between substrate 210 and gas phase atomic or molecular species 220. For example, a combination of compression (e.g., longitudinal) and shear modes (e.g., transverse) may lead to a surface wave that may propagate along an interface between a gas and a solid, with the Rayleigh mode being one that is mathematically tractable, as is known in the art. A surface wave typically penetrates into the solid medium, e.g., into substrate 210, by a distance equivalent to approximately 1-2 wavelengths. As such, an acoustic wave having a frequency of 100 MHz and a wavelength of 50 microns, traveling along the surface of an exemplary substrate having an acoustic velocity $\upsilon$ of 5000 m/s, may penetrate approximately 100 microns into the substrate. Preferably, the acoustic wave is "broadband," that is, includes many frequencies and has a relatively high bandwidth, rather than "narrowband," e.g., containing only a single frequency (such as 100 MHz) and having a relatively low bandwidth. In this regard, a narrowband single-frequency acoustic wave traveling at a solid-gas interface may be mathematically shown to only displace atoms or molecules at the interface in an elliptical pattern, but without inducing net lateral translational motion. However, it is believed that a broadband acoustic wave may induce net lateral translational motion of atoms or molecules at such an interface, thus enhancing mobility of those atoms or molecules.

Figure 2C:
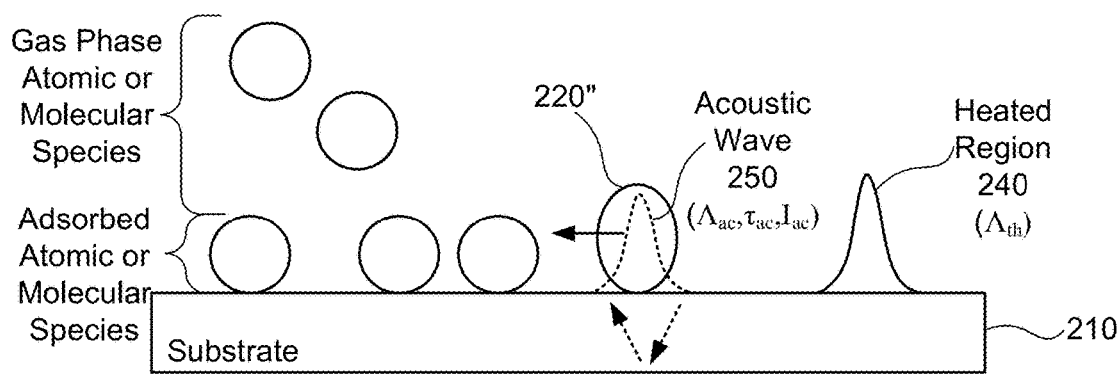

As illustrated in FIG. 2C, acoustic wave 250 is transmitted along the surface of substrate 210 from a transient heated region 240 to a second region in which adsorbed molecular species 220' is molecularly bonded to substrate 210. Here, acoustic wave 250 alters the molecular bond between the adsorbed atomic or molecular species and substrate 210, e.g., alters the strength of the molecular bond, as indicated by the deformation in adsorbed atomic or molecular species 220''. Such alteration enhances the mobility of adsorbed atomic or molecular species 220'' without requiring a corresponding increase in the bulk temperature of substrate 210, as was previously known. Note that such enhanced mobility would be unexpected based only on the equilibrium energetics of the system. Specifically, the energy of acoustic wave 250 may be on the order of a millielectron volt (meV). The energy of the molecular bond between atomic or molecular species 220'' and substrate 210 may be on the order of hundreds of meV if the bond is based on physical adsorption, e.g., a bond based on dipole-dipole interactions or the London dispersion force, or may be on the order of an eV if the bond is based on chemical adsorption, e.g., a covalent bond, an ionic bond, or a hydrogen bond. Accordingly, it would be unexpected that an acoustic wave having an energy that is orders of magnitude lower than the bond energy would be able to alter the molecular bond between atomic or molecular species 220'' and substrate 210, particularly to an extent that would enhance mobility of the atomic or molecular species.

However, without wishing to be bound by any theory, it is believed that an acoustic wave propagating at the surface of substrate 210, and having sufficient intensity and bandwidth, may induce a transient strain at that surface, and thus may momentarily alter the strength of the bond between atomic or molecular species 220'' and substrate 210. For example, an acoustic wave having a 100 MHz bandwidth in a substrate having an acoustic velocity of 5000 m/s may interact with atomic or molecular species 220'' for approximately 10 nanoseconds; it will be appreciated that the duration of such interaction may vary based on the acoustic velocity of the particular substrate being used, as well as the spatial profile $\Lambda_{ac}$ and temporal profile $\tau_{ac}$ of the acoustic wave.

As noted above, acoustic wave 250 preferably is a broadband acoustic wave. It is believed that the various frequency components of acoustic wave 250, and in particular the high frequency components, may induce a net directed force in a lateral direction on adsorbed atomic or molecular species 220''. On the microscopic scale, the transient wave may induce surface strain of local substrate atoms to which the atomic or molecular species 220'' is molecularly bonded.

The local strain may have the effect of reducing the height of the barrier that has immobilized the atomic or molecular species. The adsorbed atomic or molecular species 220" is always in random motion as consequence of local temperature (e.g., an effect known as Brownian motion in liquids). The lowering of the barrier height may provide a path along which the directed force of the acoustic wave 250 may act. Responsive to the combination of such a net directed force and the alteration in strength of the molecular bond concurrently induced by acoustic wave 250, atomic or molecular species 220" may have enhanced mobility, e.g., may move laterally along the surface of substrate 210 to which it is adsorbed. It should be appreciated that the magnitude of such enhanced mobility may depend upon the parameters of acoustic wave 250 and the nature of the molecular bond between atomic or molecular species 220" and substrate 210. Additionally, as acoustic wave 250 propagates along substrate 210, acoustic wave 250 also may interact with additional adsorbed atomic or molecular species 220', thus enhancing the mobility of such species as well. However, higher frequency components of the acoustic wave may damp as the wave propagates (as consequence of dispersion properties of the material from which substrate 210 is formed to acoustic wave propagation), with a rate proportional to the inverse of the square of the frequency.

The distance traveled by adsorbed atomic or molecular species 220" responsive to a single acoustic wave 250 may be relatively small, e.g., on the order of about one tenth of a length of the bond between atomic or molecular species 220" and substrate 210, e.g., on the order of about 0.001 nm in one example, or on the order of about 0.01 nm in another example, or on the order of about 0.1 nm in another example, or on the order of about 1 nm in another example, or on the order of about 10 nm in still another example. So as to increase the net distance traveled by atomic or molecular species 220", substrate 210 may be irradiated by a plurality of laser pulses 230 at a predetermined laser repetition rate R(t), amplitude A(t), and burst rate B(t), each laser pulse generating an acoustic wave 250 that moves species 220" an additional distance. Preferably, the repetition rate R(t) is selected such that at least some of the heat deposited by each laser pulse 230 dissipates into substrate 210 before the next laser pulse arrives, so as to reduce the buildup of heat in substrate 210; the use of a laser shot in short burst modes may further mitigate thermal buildup; the dissipation rate of such heat may depend on the thermal conductivity $\kappa$ of substrate 210. Examples of suitable repetition rates R(t) may be in the range of kHz, tens of kHz, hundreds of kHz, or even MHz or greater. Optionally, laser pulses 230 may be applied in "bursts" with a burst rate B(t) selected to permit heat to sufficiently diffuse out of heated region 240 between bursts, e.g., using a fast optical shutter. In one example, burst rate B(t) may be on the order of 1000 laser shots or less, or 10,000 laser shots or less. In addition, the laser pulse amplitudes A(t) in the burst may also be altered at a single pulse unit to further allow diffusion of heat.

Note that each acoustic wave 250 in a plurality of acoustic waves 250 need not necessarily be generated at the same physical region of substrate 210. Instead, each subsequent laser pulse 230 optionally may irradiate different regions of substrate 210, with corresponding acoustic waves 250 being generated by rapid thermal expansion of such regions. In one illustrative embodiment, a moving mirror, such as mirror 590 illustrated in FIG. 5, or other optical element may be used to dynamically direct different laser pulses 230 to different regions of substrate 210. Additionally, each acoustic wave 250 in a plurality of acoustic waves need not necessarily be generated by a single laser. Instead, one or more laser pulses 230 may be generated by a first laser, and one or more laser pulses may be generated by one or more additional lasers. Moreover, each laser pulse 230 may be spatially and/or temporally shaped using known techniques such that the corresponding acoustic waves 250 have appropriate characteristics to suitably alter the molecular bond between adsorbed atomic or molecular species 220" and substrate 210. Indeed, a sequence of laser pulses 230 from one or more lasers may be tailored such that the corresponding acoustic waves 250 interfere with one another in such a manner as to produce a specific spatial excitation mode that enhances mobility of adsorbed atomic or molecular species, while reducing the presence of waves that do not enhance mobility of adsorbed atomic or molecular species, such as standing waves. In some embodiments, the laser pulse(s) are spatially and/or temporally shaped so as to direct adsorbed atomic or molecular species into a desired pattern on substrate 210.

For example, in embodiments where laser pulse 230 is focused to a point, acoustic wave 250 may propagate radially away from that point and into the bulk as well. In embodiments where laser pulse 230 is focused to a line, acoustic wave 250 may propagate as a planar surface wave linearly away from that line. The former wave shape may be used to clear adsorbed atomic or molecular species away from an area, while the latter may be used to induce motion in a particular direction. Other spatial profiles for laser pulse 230 are possible. For example, a laser beam may be split to form multiple laser pulses 230 that are individually focused to a line or a point, but that irradiate substrate 210 in close proximity to one another. Such a technique may narrow the frequency content of the resulting acoustic wave, through interference phenomenon, and may be suitable for use in moving larger atomic or molecular species. Or, for example, two pulsed lasers that are synchronized to one another may be used to irradiate substrate 210 with different spatial profiles than one another, e.g., so as to generate a first acoustic wave with a relatively low bandwidth (e.g., 10 MHz) and a second acoustic wave with a relatively high bandwidth (e.g., 100 MHz). The sum of the two acoustic waves may be used to alter molecular bonds between adsorbed atomic or molecular species 220" and substrate 210.

Figure 2D:
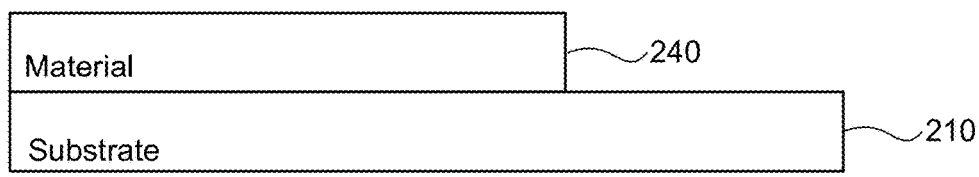

Responsive to the mobility enhancement induced by one or more acoustic waves 250, adsorbed atomic or molecular species 220" may directly form material 240 disposed on substrate 210, as illustrated in FIG. 2D, or may first undergo a further chemical reaction, e.g., with substrate 210, with another atomic or molecular species 220' adsorbed to substrate 210, or with a gas phase atomic or molecular species 220, to form material 240 illustrated in FIG. 2D.

Figure 3:
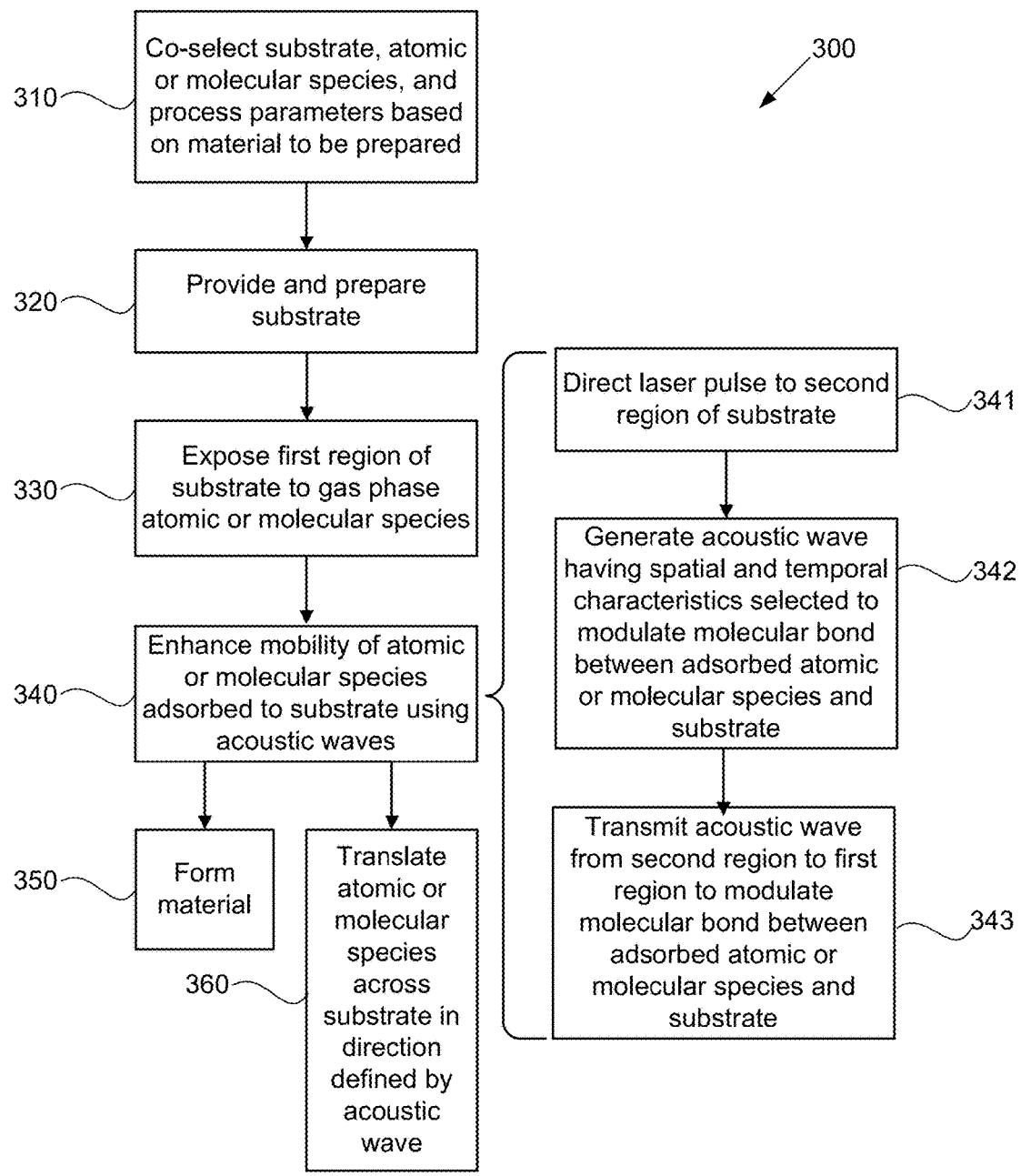
FIG. 3 illustrates steps in a method enhancing mobility of molecular species with an acoustic wave, according to one exemplary embodiment of the present invention.

Now referring to FIG. 3, an exemplary method 300 of enhancing mobility of an atomic or molecular species with an acoustic wave, according to one exemplary embodiment of the present invention. Method 300 includes co-selecting a substrate, atomic or molecular species, and process parameters based on the material to be prepared (step 310). Specifically, the process parameters may include laser parameters such as the laser pulse wavelength $\lambda_L$, temporal profile $\tau_L$, spatial profile $\Lambda_L$, and intensity $I_L$, which may be selected as described above, as may any other process parameters such as a technique for generating the atomic or molecular species (e.g., PVD or CVD based technique such as described above or known in the art), the pressure or partial pressure and flow rate of the atomic or molecular species, and the bulk temperature of the substrate.

Then, the selected substrate is provided and prepared (step 320), for example using any suitable technique known in the art. For example, the upper surface of the substrate may be suitably cleaned in preparation for forming a material thereon. The substrate may include one or more additional layers therein, including insulators, conductors, and/or semiconductors. In one embodiment, the substrate is a "low temperature substrate," by which it is meant a substrate having a damage threshold temperature that is lower than the reaction temperature of the material to be deposited therein. Examples of such substrates may include, for example, an integrated circuit, a chalcogenide glass, a ZBLAN glass, or a polymer such as polycarbonate (PC), poly(methyl methacrylate) (PMMA), polystyrene (PS), polyvinyl chloride (PVC), or polyethylene terephthalate (PET).

Figure 4:
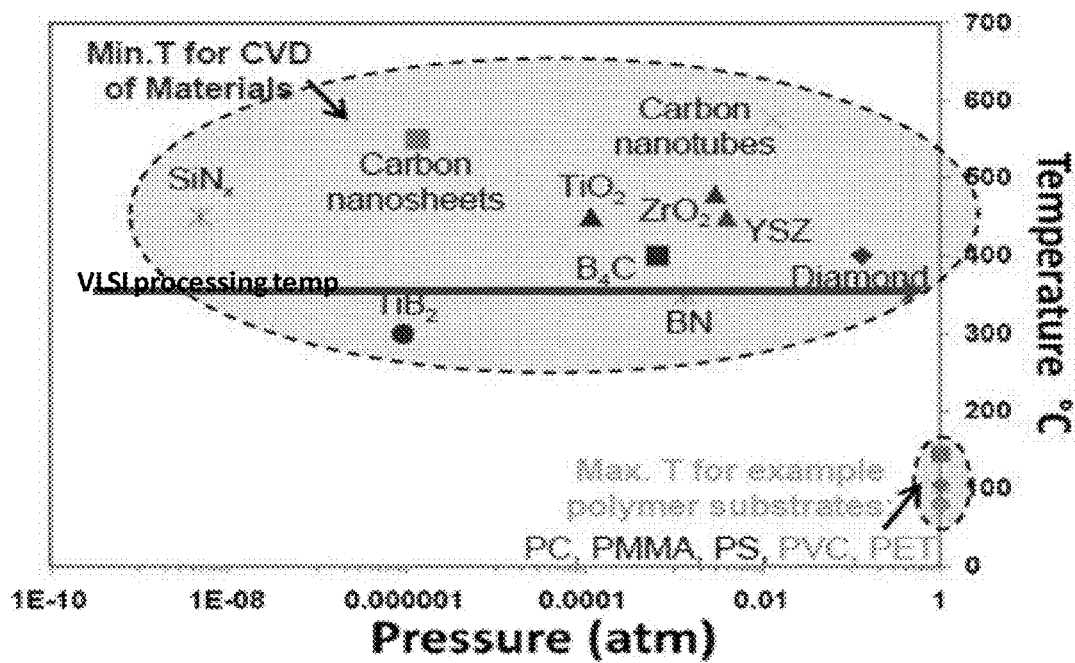
FIG. 4 illustrates damage threshold temperatures for selected substrates and reaction temperatures for selected materials.

Then, a first region of the substrate is exposed to a gas phase atomic or molecular species (step 330). Alternatively, the atomic or molecular species may be dissolved in liquid, such as a high vapor pressure solvent (e.g., methanol, ethanol, acetone), and the solvent then evaporated. Responsive to such exposure, the atomic or molecular species may adsorb on the substrate. The gas phase atomic or molecular species may be generated using physical vapor deposition (PVD) based techniques such as evaporation, sputtering, molecular beam epitaxy (MBE), and pulsed laser deposition (PLD), or chemical vapor deposition (CVD) based techniques, including atomic layer deposition (ALD), or a liquid based system. In some embodiments, the gas phase atomic or molecular species is a precursor to a technologically important material such as silicon nitride, graphene, carbon nanotubes, diamond, titanium dioxide, titanium boride, zirconium oxide, yttria-stabilized zirconium, boron carbide, boron nitride, or metal. As illustrated in FIG. 4, the reaction temperature of such materials may be significantly higher than the damage threshold temperature of low temperature substrates, e.g., polymers such as polycarbonate (PC), poly (methyl methacrylate) (PMMA), polystyrene (PS), polyvinyl chloride (PVC), or polyethylene terephthalate (PET). It may not be practicable to deposit such materials on low temperature substrates using bulk heating, because the substrate would need to be heated above its damage threshold temperature to achieve the reaction temperature of the material. Instead, enhancing the mobility of precursors to such materials on the surface of such a substrate using acoustic waves may reduce the bulk temperature to which a substrate need be heated to form the material. Alternatively, after the region is exposed to a gas phase or molecular species, the surface may be exposed to photons (e.g., such as generated by lasers, lamps, or X-ray sources), or to electrons, responsive to which the surface layer may be altered so as to allow a more efficient use of the acoustic waves to enhance surface mobility, e.g., to induce material growth or to remove atomic or molecular species from the substrate.

Note that during step 330 illustrated in FIG. 3, the entire upper surface of the substrate may be exposed to the gas phase atomic or molecular species. However, the term "first region" is intended to distinguish the region of the substrate in which molecular bonds are to be altered with an acoustic wave, from the "second region" of the substrate to be irradiated with a laser pulse so as to generate such an acoustic wave during step 340. The first and second regions may be separated from one another by any desired distance, e.g., about 10 microns or more, or about 100 microns or more, or about 1 millimeter or more, or about 10 millimeters or more, or about 100 millimeters or more, or about 1 centimeter or more.

Then, the mobility of atomic or molecular species adsorbed to the substrate is enhanced using acoustic waves (step 340). Specifically, in the embodiment illustrated in FIG. 3, a laser pulse such as described herein is directed to a second region of the substrate (step 341). The laser pulse generates a corresponding acoustic wave such as described herein, which has spatial and temporal characteristics selected to alter a molecular bond between the adsorbed atomic or molecular species and the substrate (step 342). The acoustic wave is then transmitted from the second region to the first region of the substrate so as to alter the molecular bond between the adsorbed atomic or molecular species and the substrate, thus enhancing the mobility of the atomic or molecular species as described herein (step 343).

Responsive to the alteration of the molecular bond between the adsorbed atomic or molecular species and the substrate, the atomic or molecular species may form a material such as described herein (step 350). In one specific example, the atomic or molecular species includes carbon that forms a graphene film by epitaxial growth. In another specific example, the substrate includes a metal film catalyst that has been impregnated with the atomic or molecular species, and responsive to the alteration of the molecular bond, the atomic or molecular species provides a seed for growth of material. Alternatively, the atomic or molecular species may translate across the substrate in a direction defined by the acoustic wave (step 360). In another alternative embodiment (not illustrated), the atomic or molecular species may dissociate (e.g., shed atoms) to form a more chemically energetic species, such as a radical. Such energetic species may induce a surface chemical reaction, such as the formation of graphene by methane/ethane carbon source adsorption.

Figure 5:
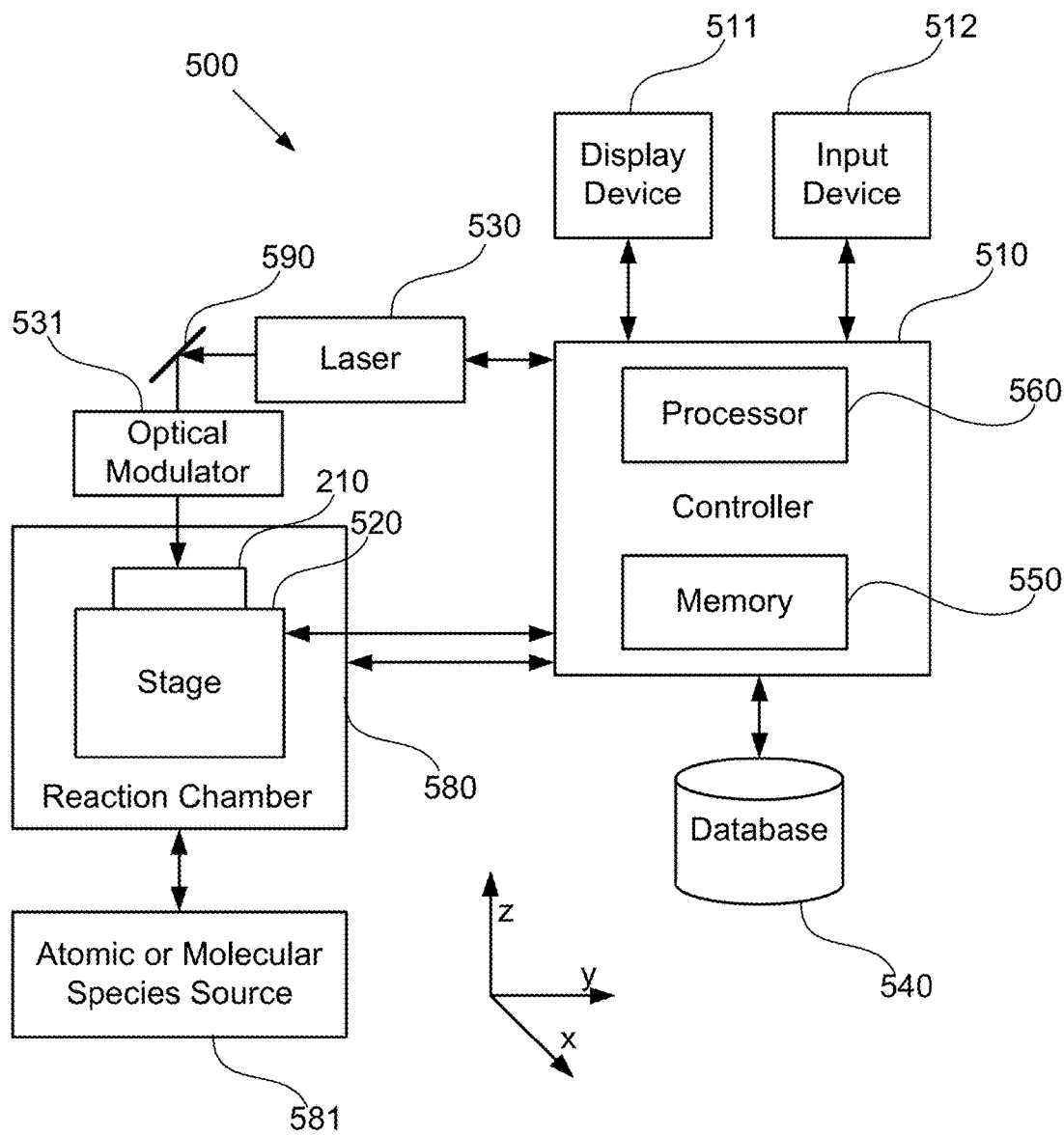
FIG. 5 illustrates a system for preparing a material at reduced bulk temperature by enhancing mobility of molecular species with an acoustic wave, according to one exemplary embodiment of the present invention.

FIG. 5 schematically illustrates a system 500 for use in enhancing the mobility of molecular species on a substrate, according to one exemplary embodiment of the present invention. System 500 includes controller 510, stage 520, laser 530, database 540, reaction chamber 580, and mirror 590. Reaction chamber 580 includes an optical window (not shown) via which the laser beam may irradiate the interior of the chamber. Controller 510 is in operable communication with stage 520, laser 530, database 540, reaction chamber 580, and mirror 590 (communication with mirror 590 not shown). The system also may include optical modulator 531 disposed along the optical path between laser 530 and reaction chamber 580. Preferably, optical modulator 531 includes an electro-optic fast shutter system or pulse slicer configured to modify the laser pulse amplitudes A(t) for each shot, the burst rate B(t), and the laser pulse time profile, and is controlled by the processor/controller 510. Controller 510 includes memory 550 (e.g., a computer-readable medium) configured to store processing instructions, processor 560 configured to store the stored processing instructions, display device 511 configured to display data to a user, and input device 512 configured to accept input from a user. Database 540 contains information on how to prepare a variety of different types of materials, or otherwise process a substrate, by enhancing mobility of molecular species. Database 540 may be integral to controller 510, or may be remote to controller 510 and in operable communication with controller 510 via a network, such as the Internet.

Stage 520 is positioned within reaction chamber 580 and supports substrate 210, and is operable to adjust the position of the substrate in the x, y, and z directions responsive to instructions from controller 510. Alternatively, mirror 590 may include a high speed scanning mirror with a compensating Z-motion focus unit that is configured to move the laser beam while maintaining substrate 210 in a stationary position. During execution of step 340 of FIG. 3, laser 530 emits light of a wavelength selected to be absorbed by substrate 310 so as to rapidly heat an irradiated region of substrate 310, and thus generate an acoustic wave. In other embodiments (not shown) one or more additional lasers may be provided to heat substrate 310 so as to generate acoustic waves.

Mirror 590 directs the light from laser 530 toward one or more regions of substrate 210 in accordance with instructions from controller 510, preferably through a window or port-hole in reaction chamber 580. In an alternative embodiment (not shown), stage 520 is used to move substrate 210 relative to the laser beam, instead of using mirror 590 to direct the light to different portions of substrate 210. For example, for relatively large reaction chambers (e.g., chambers configured to accommodate one or more substrates having a collective area of one or more square meters, or ten or more square meters, such as industrial autoclaves) it may be preferable to move the laser beam using mirror 590, rather than moving stage 520. Reaction chamber 580 is configured to maintain substrate 210 at a selected pressure or partial pressure of molecular species generated by atomic or molecular species source 581 during the appropriate processing time, as well as at a selected bulk temperature (which may be significantly lower than the bulk temperature that may be required in the absence of the acoustic waves). Note that if substrate 210 is to be exposed to different types of atomic or molecular species, then one or more corresponding atomic or molecular species sources 581 may be provided and configured to provide such species to reaction chamber 580 as appropriate under control of controller 510.

Responsive to user input provided through input device 512, e.g., user input defining the material to be prepared on substrate 210 or other processing to be performed on substrate 210, controller 510 requests database 540 to provide information on how to prepare that type of material or to perform such processing. Responsive to the request, database 540 provides some or all of the following information to controller 510: the type of substrate 210 to be used; any required preparation thereof; the wavelength(s) and other parameters of laser light to be used; the type of atomic or molecular species source to be used and any parameters thereof, including the pressure or partial pressure of the atomic or molecular species; and any additional processing to be performed after exposing the substrate 210 to the atomic or molecular species and laser light. Controller 510 receives this information and stores it in memory 550. Processor 560 processes the stored information, and based on that information displays instructions to the user via display device 511 and controls stage 520, laser 530, reaction chamber 580, and mirror 590 to process the substrate 210 as appropriate.

In one example, the user uses input device 512, e.g., a keyboard and mouse, to input to the controller that he desires to prepare a particular material disposed on a particular substrate, e.g., a $TiO_2$ film on a PMMA substrate. Responsive to that input, controller 510 requests database 540 to provide information on preparing such a structure. Responsive to the request, database 540 provides a set of instructions to the controller 510, which controller 510 stores in memory 550. Processor 560 then processes the stored instructions to determine what information is to be displayed to the user via display device 511, and how the various components of the system are to be controlled. For example, processor 560 may cause display device 511 to display the type of substrate and molecular species to be used so that the user may obtain and prepare the substrate and molecular species, to the extent that system 500 is not configured to obtain the substrate and molecular species automatically (without further user intervention).

Next, the user places the prepared substrate 210 on stage 520 and uses input device 512 to inform controller 510 that the substrate is ready. Responsive to this input, processor 560 instructs stage 520 to move to a first pre-determined position in the x, y, and z directions and instructs reaction chamber 580 to expose substrate 310 to an atomic or molecular species from molecular species source 581 at a suitable pressure or partial pressure, based on the stored instructions. Processor 560 then instructs laser 530 to emit light having wavelength and other parameters such as described herein, and instructs mirror 590 to guide that light to the appropriate region(s) of substrate 210. The light then generates an acoustic wave that enhances the mobility of molecular species adsorbed to substrate 210.

Those of skill in the art will appreciate that any of the user-performed steps may alternatively be automated using commercially available equipment (not illustrated). For example, in certain industrial applications, a process script profile may be provided that controls gases, laser, motion and timing. For example, instead of displaying to the user what type of substrate and film is to be provided, controller 510 may instead be in operable communication with a robotic substrate handler that may obtain substrate 210 from a substrate store, and may process the substrate as appropriate. In one example, the substrate may be automatically dispensed e.g., using a tape dispensing roller. In one embodiment, one or more steps of an instruction sequence are made contingent on a feedback parameter, such as a spectrum of light reflected from the substrate, or a change in reflectivity of the substrate resulting from deposition of material.

For example, a pulsed laser beam from a separate probe laser (not shown) may be used to periodically irradiate a region of the substrate 210 where a material is being deposited, and a reflected portion of the probe beam then input into a photodetector (also not shown) in communication with controller 510. The output of the photodetector may be analyzed to determine whether a material had been deposited on the region of the substrate, and if so, how much. For example, controller 510 may include software stored in memory 550 operable on processor 560 for determining, based on the photodetector output, whether the reflectivity of the substrate changed as a result of material deposition in the irradiated region, and/or whether the reflectivity indicates that a sufficient thickness of material has been deposited in that region. If the controller 510 determines that the material has been deposited to a sufficient thickness, then controller 510 may instruct stage 520 to move substrate 210 such that a different region of the substrate is irradiated by laser 530 and by the probe laser. In addition, a laser heterodyne sensor may be provided that includes a continuous wave (CW) laser configured to generate light that is reflected off of the surface of substrate 210 onto a photodetector (not shown). The laser heterodyne sensor may monitor minute surface deflections (e.g., deflections generated by the acoustic wave) to check the acoustic wave profile and amplitude at various location on the substrate.

EXAMPLES

Some non-limiting examples of enhanced molecular mobility on a substrate at reduced bulk temperature will now be described with reference to FIGS. 6A-9B.

Specifically, a series of experiments using gold clusters having low numbers of gold atoms were used as the atomic or molecular species, and a polished glass ceramic surface, specifically lithium aluminosilicate, was used as the substrate. The experiments were performed at room temperature, and unless otherwise noted the images are optical microscope images at 100× magnification. Gold clusters were selected as the molecular species because their locations on the substrate could readily be evaluated using optical emission microscopy, as described below. It is believed that the results described below may be generalized to other atomic or molecular species and other substrates.

Figure 6A:
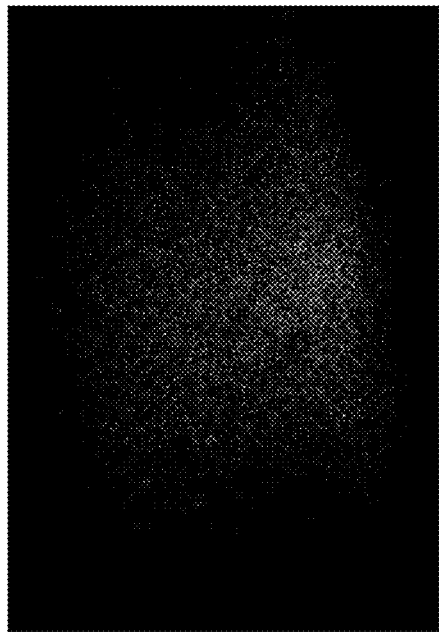
FIGS. 6A-6D are microscopic images of gold species disposed on a substrate under different focus and displacement conditions, according to one exemplary embodiment of the present invention.
Figure 6B:
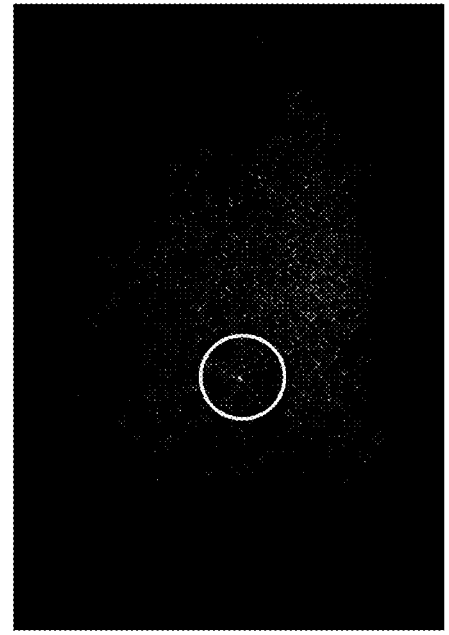
Figure 6C:
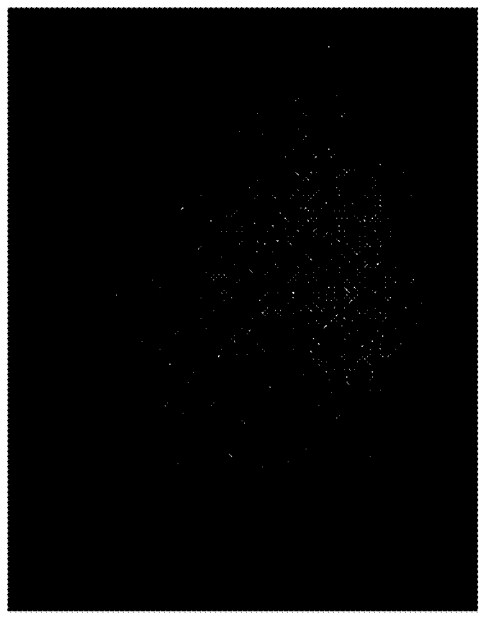
Figure 6D:
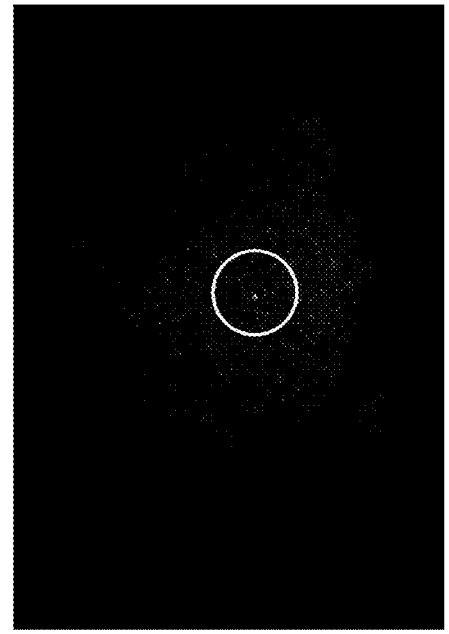

The gold clusters were formed by drop-casting a solution of 8 nm gold nanoparticles on the lithium aluminosilicate substrate. The nanoparticles then were irradiated with 532 nm light from a Quantaray laser having an 8 ns pulse with, a repetition rate of 100 Hz, and approximately <1 mJ per laser pulse. The gold nanoparticles absorbed and were ablated by the light, generating a plurality of gold clusters of varying sizes, that is, containing different numbers of gold atoms than one another. FIG. 6A is an image of the gold nanoparticles prior to ablation, and FIG. 6B is an image of the resulting field of gold clusters following ablation, filtered through a 455 nm optical filter (described in greater detail below), in which a gold cluster of particular interest is circled. FIG. 6C is an out-of-focus, filtered image of the same field, so as to demonstrate that the cluster of interest is in the focal plane of the image (rather than a speck of dust on the microscope), and FIG. 6D is an in-focus, filtered image of the same field following lateral translation of the substrate, so as to demonstrate that the gold cluster of interest is coupled to the substrate.

Figure 7A:
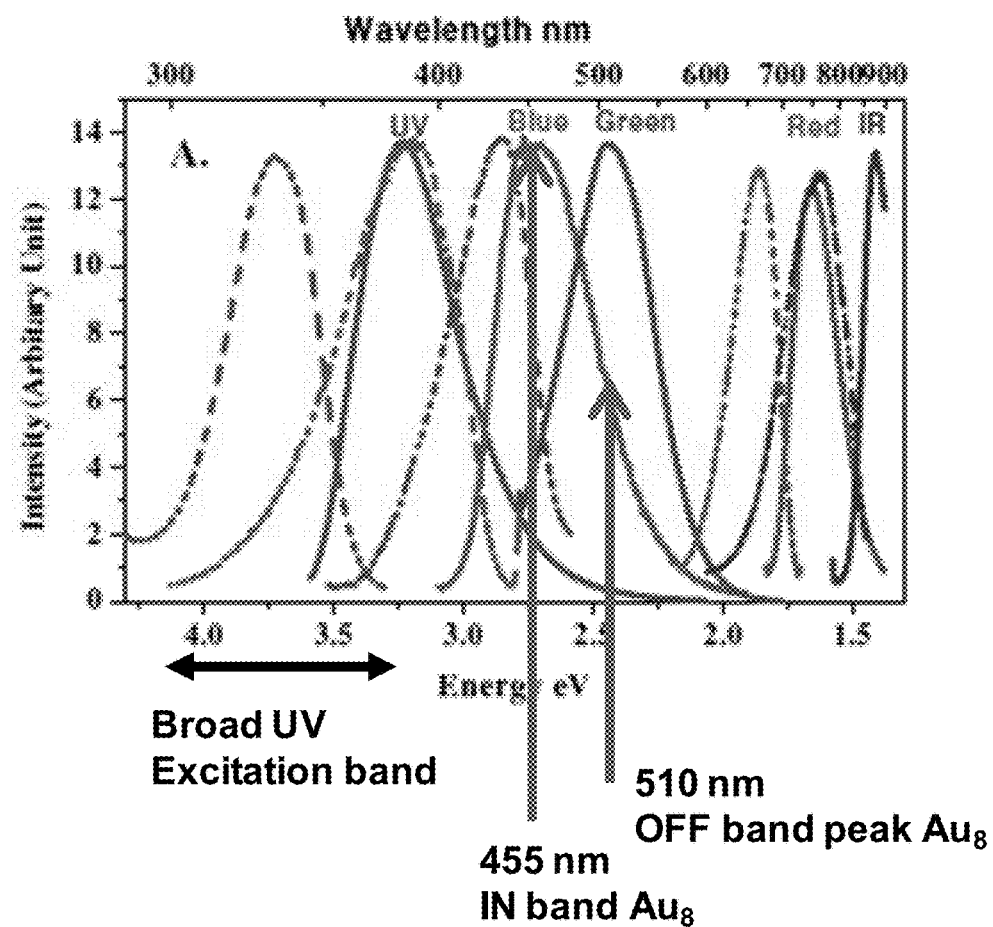
FIG. 7A illustrates excitation (dashed) and emission (solid) spectra of different gold molecular species.
Figure 7B:
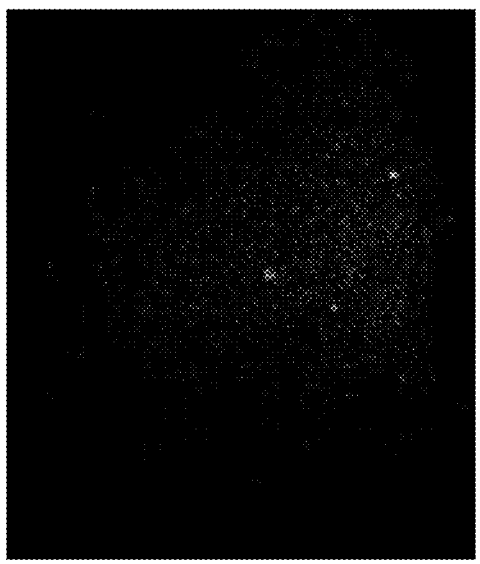
FIGS. 7B-7C are microscopic images of gold molecular species disposed on a substrate under different optical filters, according to one exemplary embodiment of the present invention.
Figure 7C:
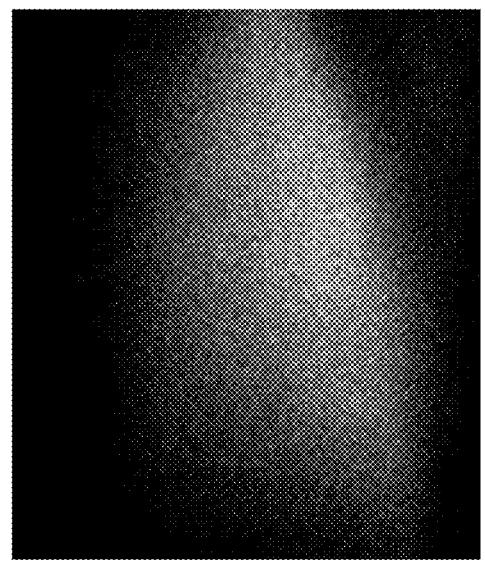

As is known in the art and as illustrated in FIG. 7A, different gold clusters have different excitation (dashed lines) and emission (solid lines) characteristics than one another. So as to observe the behavior of only a single size of gold clusters, specifically clusters having eight gold atoms ($Au_8$), the field of gold clusters was irradiated using broad-band ultraviolet light (approximately 300-400 nm), so as to excite the $Au_8$ clusters. FIG. 7B is an image of the field of gold clusters obtained using a 455 nm filter, which is in the emission band for $Au_8$ clusters, and in which several clusters appear bright. FIG. 7C is an image of the field of gold clusters obtained using a 510 nm filter, which is off the emission band peak for $Au_8$ clusters, in which different clusters appear bright. Such results suggest that the bright clusters in FIG. 7B (as well as in FIGS. 6B and 6D) have spectroscopic attributes and likely correspond to $Au_8$ clusters. An analogous experiment was performed but with exciting the clusters with blue light (approximately 400-480 nm) instead of ultraviolet light, in which it was observed that substantially no clusters appeared bright using the 455 nm filter, while others appeared bright using the 510 nm, suggesting that those clusters likely correspond to $Au_{13}$.

Figure 8A:
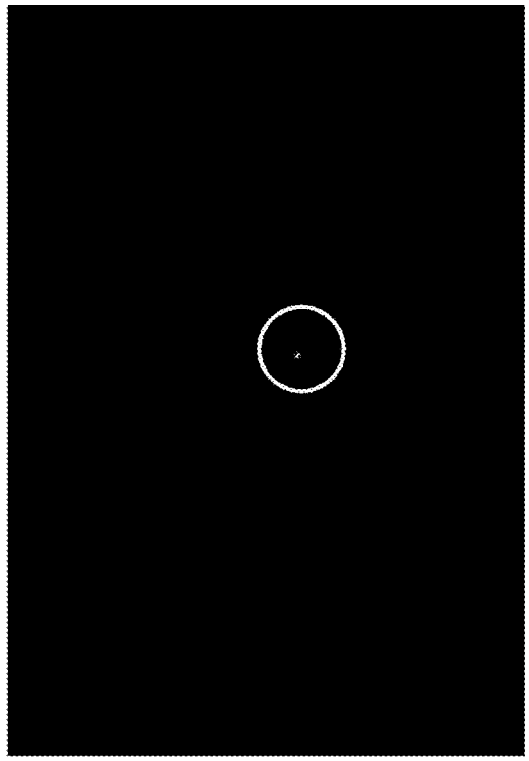
FIGS. 8A-8B are microscopic images of a gold molecular species disposed on a substrate before and after repeated exposure to acoustic waves, respectively, according to one exemplary embodiment of the present invention.
Figure 8B:
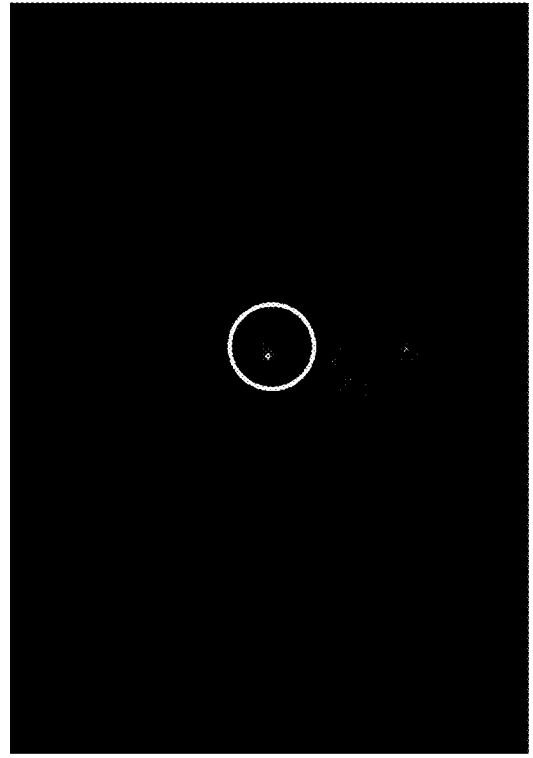
Figure 8C:
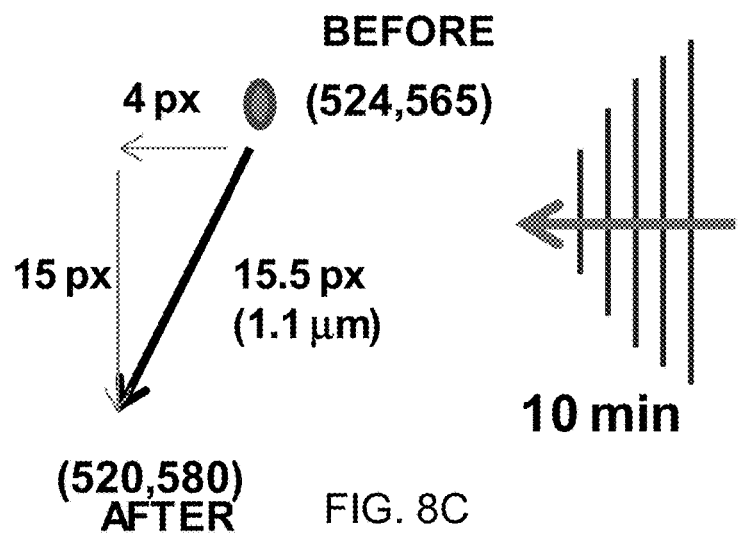
FIGS. 8C-8E schematically illustrate the measured travel of a gold molecular species across a substrate during repeated exposure to acoustic waves generated with laser pulses of different energies than one another, according to exemplary embodiments of the present invention.

The motion of $Au_8$ clusters responsive to interactions with acoustic waves generated in the lithium aluminosilicate substrate then was characterized. A Quantaray Nd-Yag laser operating at 355 nm, <70 mJ/pulse was used to generate the acoustic waves. Specifically, FIG. 8A is an average of approximately 100 "before" images of a specific $Au_8$ cluster that were obtained using a 455 nm filter such as described above. The average pixel position of the "before" cluster was determined to have the coordinates (524,565), as schematically illustrated in FIG. 8C. The substrate then was irradiated for 10 minutes with a sequence of pulses from the above-described Quantaray laser, which were shaped as lines with a pseudo-Gaussian profile, a width of approximately 50 microns at FWHM, and a length of approximately 5 mm, and that irradiated the substrate at a distance approximately 2.5 to 3 cm away from the $Au_8$ cluster. FIG. 8B is an average of approximately 100 "after" images of the same $Au_8$ cluster as in FIG. 8B, following such irradiation. The images were analyzed using optical image processing software to remove nascent vibration of the apparatus. It may be seen that the cluster moved perceptibly. Indeed, the average position of the "after" cluster was determined to have the coordinates (520,580), as schematically illustrated in FIG. 8C. Such a change in position corresponds to a net motion of approximately 4 pixels to the left and 15 pixels down. It was determined that each pixel corresponds to approximately 287.7 nm based on the measured microscope point spread function, so the cluster's net travel of 15.5 pixels corresponds to approximately 1.1 microns of motion during the ten minutes of irradiation, for a rate of approximately 0.11 micron per minute or 0.02 nm per laser pulse. It is believed that higher laser repetition rates may result in higher rates of motion.

Figure 8D:
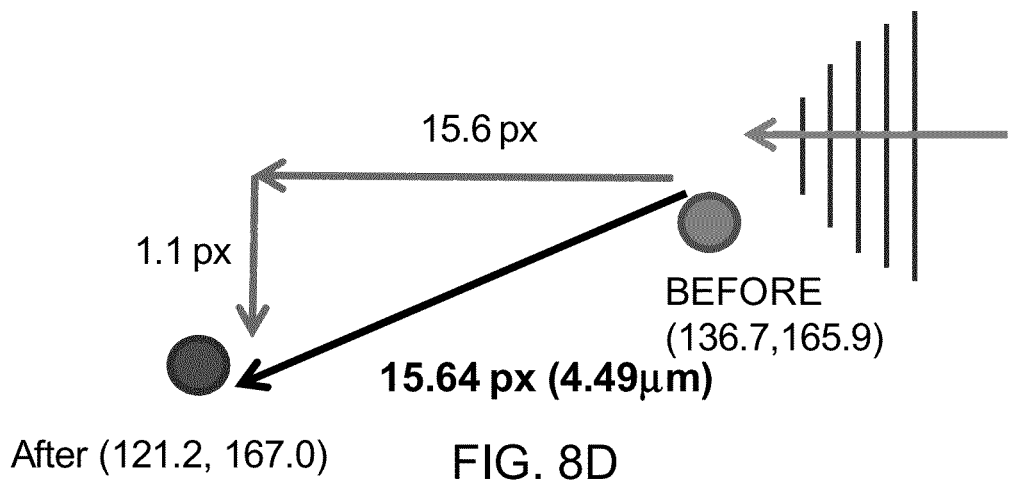
Figure 8E:
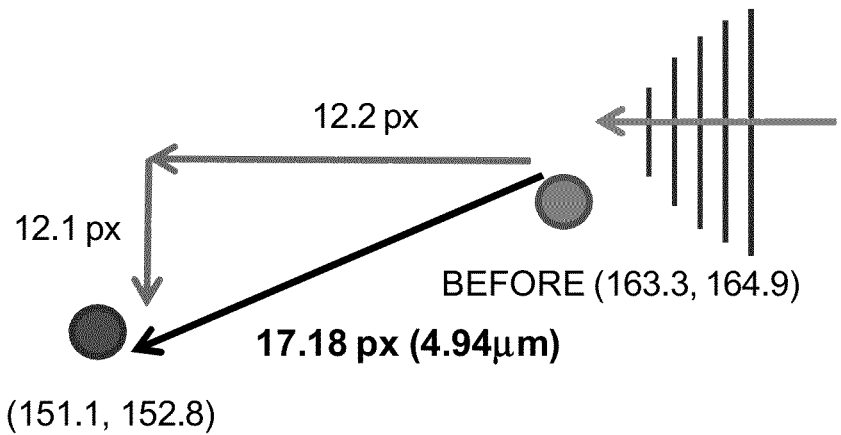

FIGS. 8D-8E schematically represent cluster motion that was measured during experiments analogous to those described above with reference to FIGS. 8A-8C. Specifically, FIG. 8D schematically represents the results of an experiment in which pulses from the Quantaray laser having an average power of 251 mW were used to irradiate the substrate in a manner analogous to that described above. Before the irradiation, an $Au_8$ cluster of interest was observed to have an average pixel coordinate of (136.7, 165.9), and after 35 minutes of irradiation to have an average pixel coordinate of (121.2,167.0). Such a change in position corresponds to a net motion of approximately 15.6 pixels to the left and 1.1 pixels down, or a total motion of about 15.64 pixels, or 4.49 microns, with a rate of about 0.13 microns per minute, or about 0.02 nm per laser pulse. FIG. 8E schematically represents the results of an experiment in which pulses from the Quantaray laser having an average power approximately 55% higher than those in FIG. 8D were used to irradiate the substrate in a manner analogous to that described above. Before the irradiation, an $Au_8$ cluster of interest was observed to have an average pixel coordinate of (163.3,164.9), and after 30 minutes of irradiation to have an average pixel coordinate of (151.1,152.8). Such a change in position corresponds to a net motion of approximately 12.2 pixels to the left and 12.1 pixels down, or a total motion of about 17.18 pixels, or 4.94 microns, with a rate of about 0.165 microns per minute, or about 0.03 nm per laser pulse. Thus, it may be seen that increasing laser pulse intensity may provide molecular species with even greater enhancements in mobility.

Figure 9A:
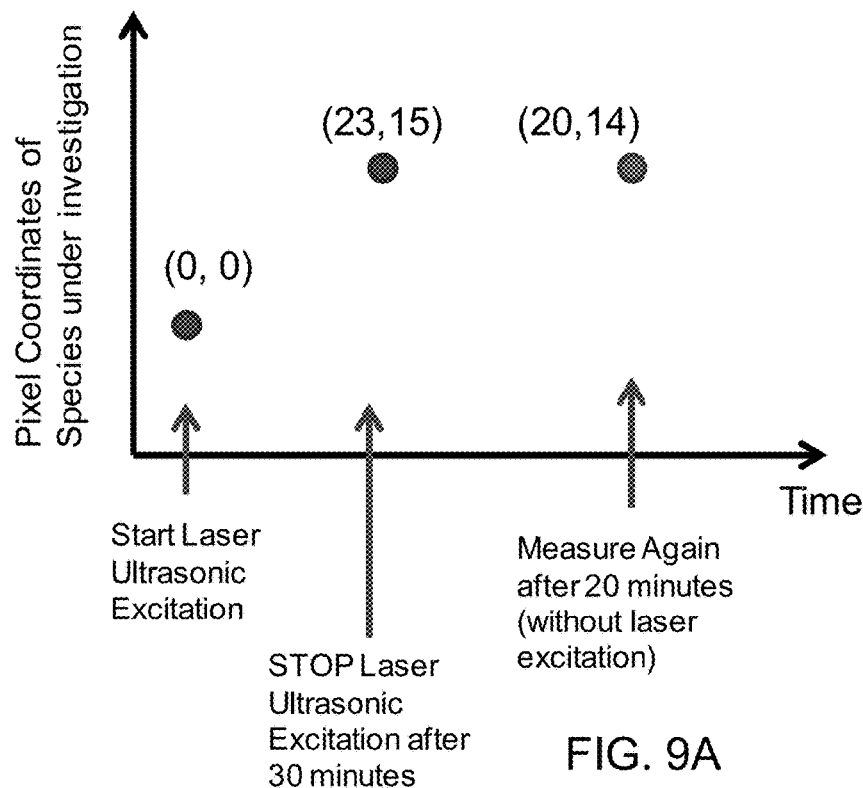
FIGS. 9A-9B schematically illustrate the measured travel of a gold species across a substrate during a first period of repeated exposure to acoustic waves and a second period of no exposure to acoustic waves, according to one exemplary embodiment of the present invention.
Figure 9B:
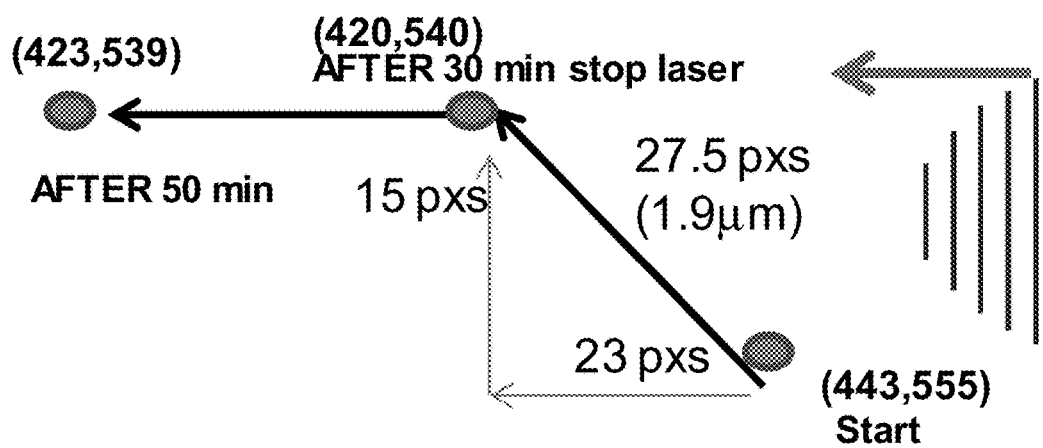

FIGS. 9A-9B schematically represent cluster motion that was measured during experiments analogous to those described above with reference to FIGS. 8A-8E. Specifically, FIGS. 9A-9B schematically represent the results of an experiment in which pulses from the Quantaray laser were used to irradiate the substrate in a manner analogous to that described above. Before the irradiation, an $Au_8$ cluster of interest was defined to have an average pixel coordinate of (0,0) in FIG. 9A, or an observed pixel coordinate of (443, 555) in FIG. 9B, and after 30 minutes of irradiation to have an average pixel coordinate of (23,15) in FIG. 9A, or average pixel coordinate of (420,540) in FIG. 9B. Such a change in position corresponds to a net motion of approximately 23 pixels to the left and 15 pixels down, or a total motion of about 27.5 pixels, or 1.9 microns, with a rate of about 63.3 nm per minute, or about 0.01 nm per laser pulse. After the 30 minutes of irradiation, the laser pulses were blocked, and 20 minutes later the average position of cluster was again observed. The cluster then had an average pixel coordinate of (20,14) in FIG. 9A, or of (423,539) in FIG. 9B. Accordingly, it may be inferred that in the presence of laser-generated acoustic waves, molecular species may have enhanced mobility.

The above experiments demonstrate that molecular species may be moved in a desired lateral direction on a substrate using broadband acoustic waves, e.g., by approximately a bond length (0.2-0.3 nm) for every ten applied laser pulses. To appreciate such a result, consider that the diffusion coefficient of a small molecule in water is on the order of $10^{-5}$ cm$^2$/second. If the above data for Au$_8$ were to be fit to a mean square displacement law from which a diffusion coefficient could be derived, the resulting value would be approximately $3.7 \times 10^{-5}$ cm$^2$/second—comparable to that of a small molecule in water, but on a dry surface and at room temperature. Additionally, it should be noted that heat-driven diffusion is a "random walk" phenomenon, while the above experiments demonstrate that directed motion may be achieved using acoustic waves that have been shaped to generate a propagating line wave (which may be referred to as a plane wave in the art). Additionally, because the motion is directed, it also may be used to pattern a substrate surface with selected molecular species without the use of masks or optical lithography. As such, embodiments of the invention not only facilitate the growth of materials at reduced temperature, but also may be used to remove or "clean" unwanted molecular species from delicate surfaces, or from catalytic surfaces, or to inhibit such species from ever binding to the surface. For example, catalysts tend to get poisoned or lose efficiency over time, and acoustic waves may be used to rejuvenate such catalysts by inhibiting binding between the catalyst and undesired molecular species. Or, for example, acoustic waves may be used to inhibit growth or binding of bacteria on surfaces, such as surgical instruments, thus sterilizing the instruments and reducing or obviating the need for chemical or thermal sterilization.

Additionally, because acoustic waves propagate by inducing local strain, and small strain rates (e.g., on the order of $10^{-3}$/second) have been observed to induce nucleation (e.g., annealing, removing) of surface dislocations, it is believed that certain embodiments of the present invention may be used to anneal defects such as kinks, terraces, or slip faults at the surface of a substrate or a material disposed on a substrate. As devices become small, the ratio of the surface area to volume increases. Consequently, surface defects may limit reliability, which may be ameliorated using acoustic waves such as described herein. On the other hand, some types of surface waves may propagate to form solitons, which do not disperse with wavelength, while other types of surface waves may form shock fronts. The soliton waves may carry the surface energy farther, while the nonlinear or shock front waves may be used to crack or induce defects.

While various illustrative embodiments of the invention are described above, it will be apparent to one skilled in the art that various changes and modifications may be made therein without departing from the invention. The appended claims are intended to cover all such changes and modifications that fall within the true spirit and scope of the invention.

What is claimed:

1. A structure comprising:
   a substrate comprising a first material having a threshold temperature above which the first material is damaged; and
   a layer consisting essentially of silicon nitride, graphene, diamond, titanium dioxide, titanium boride, zirconium oxide, yttria-stabilized zirconium, boron carbide, boron nitride, or metal molecularly bonded to the first material of the substrate, the layer being formed on the substrate at a reaction temperature that is higher than the threshold temperature of the first material, wherein an interface between the substrate and the layer comprises annealed kinks, annealed terraces, or annealed slip faults.

2. The structure of claim 1, wherein the substrate comprises an integrated circuit, a chalcogenide glass, a ZBLAN glass, or a polymer.

3. The structure of claim 2, wherein the polymer comprises polycarbonate, poly(methyl methacrylate), polystyrene, polyvinyl chloride, or polyethylene terephthalate.

* * * * *